(12) United States Patent
Smith et al.

(10) Patent No.: US 6,970,032 B1
(45) Date of Patent: Nov. 29, 2005

(54) POWER SUPPLY DETECTING INPUT RECEIVER CIRCUIT AND METHOD

(75) Inventors: Chris Smith, Essex Junction, VT (US); David Chapman, Shelburne, VT (US); Tim Fiscus, South Burlington, VT (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/785,599

(22) Filed: Feb. 24, 2004

Related U.S. Application Data

(60) Provisional application No. 60/457,392, filed on Mar. 25, 2003.

(51) Int. Cl.[7] ............................................. H03K 17/62
(52) U.S. Cl. ...................... 327/407; 327/534
(58) Field of Search ............................. 327/407, 408, 327/409, 410, 411, 412, 413, 530, 534, 535, 327/540, 541, 545, 546

(56) References Cited

U.S. PATENT DOCUMENTS

| | | | | |
|---|---|---|---|---|
| 4,617,473 A | * | 10/1986 | Bingham | .................. 307/66 |
| 5,703,415 A | * | 12/1997 | Tanaka | .................. 307/66 |
| 5,886,561 A | * | 3/1999 | Eitan et al. | .................. 327/408 |
| 6,040,718 A | * | 3/2000 | Henry | .................. 327/71 |
| 6,548,916 B1 | | 4/2003 | Kanazawa et al. | |
| 6,600,239 B2 | | 7/2003 | Winick et al. | |
| 6,642,750 B1 | * | 11/2003 | Egan | .................. 327/63 |

* cited by examiner

Primary Examiner—Jeffrey Zweizig
(74) Attorney, Agent, or Firm—Bradley T. Sako

(57) ABSTRACT

A power supply detecting input receiver circuit (300) can include a multiplexing capability that can select one of at least two power supplies during a non-critical timing period. Such selection of a power supply can reduce both the standby and the active current of input receiver circuit (300). In one arrangement, an input receiver circuit (300) can include a comparator (310), a latch (316), and a select circuit (304). A latch (316) can be enabled to indicate a selection of a supply upon a circuit power-up, as but one example. A method is disclosed that includes comparing at least two supply voltages, setting a latch to indicate a selected supply, and providing the selected supply to an input receiver. The receiver output signal may be voltage-translated to a suitable internal supply level.

17 Claims, 6 Drawing Sheets

POWER SUPPLY DETECTING INPUT RECEIVER CIRCUIT AND METHOD

This application claims the benefit of provisional Ser. No. 60/457,392, filed Mar. 25, 2003.

TECHNICAL FIELD

The present invention relates generally to power supply input receivers for integrated circuit devices, and more particularly to an input receiver configured to select between two or more power supplies.

BACKGROUND OF THE INVENTION

To provide power to an integrated circuit device (e.g., chip), a chip typically includes an input receiver for a power supply voltage. To better understand various aspects of the disclosed embodiments of the invention, a number of conventional input receiver arrangements will be described.

A first conventional chip input receiver arrangement will now be described with reference to FIG. 8. FIG. 8 shows a chip designated by the general reference character 800. A chip 800 can receive an external power supply voltage VCC at a power supply input pad 802. In addition, an input signal (in) can be received at a corresponding signal input pad 804. Chip 800 also provides an internal supply voltage VPWR, which can be generated by a voltage regulator 806. Such an internal supply voltage can be provided to an internal portion 808 of chip 800.

An input receiver 810 can receive input signal (in), and in response thereto, provide an output signal (out) to internal portion 808. It is understood that input receiver 810 may include voltage translator circuits that can ensure that output signal out stays within an internal power supply range, which in this case is from VPWR to ground.

As shown in FIG. 8, input receiver 810 receives a high power supply voltage VCC power from an external source (i.e., power supply input pad 802), and circuits within input receiver 810 operate between a VCC potential and a lower power supply potential (e.g., ground). As will be described at a later point herein, such an arrangement, depending the relative level levels of VCC and input signal in, may have undesirable static and active current consumption.

A second conventional example is shown in FIG. 9. FIG. 9 includes the same general arrangement as FIG. 8, thus like components are referred to by the same reference characters but with the first digit being a "9" instead of an "8".

The arrangement of FIG. 9 differs from that of FIG. 8 in that input receiver 910 receives an internally generated power supply VPWR. Circuits within input receiver 910 operate between a VPWR potential and a lower power supply potential (e.g., ground). This arrangement may also have undesirable static and active current consumption. Such drawbacks will also be described at a later point herein.

Accordingly, the above arrangements may not be optimal, especially for applications that may require multiple power supply configurations. One or more of these configurations will likely draw excessive current. An example of a chip that might require multiple power supply configurations is where a single die includes multiple die options to serve various markets. These configurations can be chosen by permanent selection methods, such as bond-options, fuse-options, or metal options, and the like. Further, a chip may provide one power supply level for input/output (I/O) pins, while generating a different internal power supply.

A third conventional example is shown in FIG. 10 and includes some of the same general components as FIG. 8. Accordingly, like components are referred to by the same reference characters but with the first digit being a "10" instead of an "8".

Unlike the arrangement of FIG. 8, in FIG. 10 multiple input receivers 1010-0 and 1010-1 are provided for each signal input pad 1004. One input receiver circuit (e.g., 1010-0 or 1010-1) can be permanently enabled while the other is permanently disabled according to a desired option.

A first drawback to the arrangement such as that shown in FIG. 10 can be the increased layout area required in forming two input receivers as opposed to only one. This can increase production costs. A second drawback can be that an input signal is applied to multiple receiver circuits, resulting in higher input capacitance. A third drawback can be that there is typically not much flexibility in which receiver is selected. That is, a given configuration will be permanently set to either one receiver or the other, perhaps by the bond arrangement, fuse blowing, or metal means, and the like.

In light of the above, it would be desirable to arrive at some form of input receiver that can accommodate multiple power supplies, but not suffer from the drawbacks of the above conventional approaches, such as high standby and active currents, large circuit layout area, and high pin input capacitance.

SUMMARY OF THE INVENTION

The present invention can include a circuit that selects between at least two power supplies. The circuit can include an input receiver, coupled to receive an input signal and a receiver supply, that generates a receiver output signal. A supply comparator can have inputs coupled to the power supplies and can generate at least one select signal. A select circuit can be coupled to the at least two power supplies and a drive supply. A latch can be coupled to the at least one select signal and to the select circuit. A voltage level translation circuit can be coupled to the receiver output and providing a circuit output.

Such an arrangement can allow an optimal power supply voltage level to be supplied for a given input signal. An optimal power supply voltage level can be a level that results in lower current consumption than other power supply levels.

According to one aspect of the embodiments, an input receiver can further include a driver circuit that receives the input signal and generates an internal input signal. The driver circuit can include at least a first driver transistor having a source coupled to the drive supply and a gate coupled to the input signal.

Such a driver circuit can benefit from selection of a given power supply voltage by minimizing a gate to source voltage for the driver transistor, when such a driver transistor should be turned off.

According to another aspect of the embodiments, a driver circuit can be a complementary-metal-oxide-semiconductor (CMOS) type driver.

Utilization of a CMOS type driver can reduce current consumption. Further, a power supply voltage can be selected to minimize a gate to source voltage for a p-channel transistor (PMOS) and/or minimize time spent in a high active current transition times.

According to another aspect of the embodiments, an input receiver can further include a first disable device that isolates the driver circuit from at least one power supply in response to an enable signal. According to another aspect of the embodiments, an input receiver can include a second disable device that couples an output of the driver circuit to the drive supply in response to an enable signal.

Disable devices can allow an input receiver to be placed in a high impedance state, and/or ensure that the input receiver does not operate until the optimal power supply has been selected or the chip is otherwise ready to receive input signals.

According to another aspect of the embodiments, a select circuit can include a multiplexer having inputs coupled to the at least two power supplies. The multiplexer can be controlled according to an output of the latch.

This arrangement can allow for a non-permanent selection of an optimal power supply. Thus, one chip design can be flexibly adapted to accommodate various power supply level ranges.

According to another aspect of the embodiments, a latch can be enabled in response to a power up signal.

Such an arrangement can help ensure that a select signal is latched only after power-up operations have been completed.

The present invention also includes a method of controlling a power supply path to an input receiver. The method can include comparing at least two power supply voltages to one another, setting a latch to indicate one of the power supplies as a selected supply according to the comparison, and providing the selected supply to the input receiver according to the setting of the latch.

According to one aspect of the embodiments, the step of setting the latch can occur substantially during a power-up of an integrated circuit containing the input receiver circuit.

According to another aspect of the embodiments, the step of setting the latch can include setting the latch to indicate the power supply having the lowest magnitude voltage.

According to another aspect of the embodiments, the method can further include level shifting an output from the input receiver to generate an output signal that varies between predetermined logic levels regardless of which power supply is selected.

Level shifting ensures compatibility with other internal circuits within a semiconductor device.

The present invention may also include an input receiver circuit. The input receiver circuit can include a comparator circuit that generates a select signal in response to a comparison between at least two power supply voltages. A select circuit can couple one of the power supply voltages to a drive node according to the select signal. A drive circuit can drive an internal input signal between the potential of the drive node and another predetermined potential in response to an input signal.

According to one aspect of the embodiments, a comparator circuit can include a comparator having inputs coupled to the power supplies and an output coupled to a passgate. The passgate can be enabled in response to a power-up signal having a first value.

Such an arrangement can isolate a comparator output from influencing a select signal value once power-up operations have been completed.

According to another aspect of the embodiments, a comparator circuit can further include a latch having an input coupled to an output of the passgate, and a latch output that provides the select signal. The latch can be enabled in response to the power-up signal having a second value.

According to another aspect of the embodiments, an input receiver circuit can include a select circuit having a first supply transistor having a source-drain path coupled between a first supply voltage and the drive node and a second supply transistor having a source-drain path coupled between a second supply voltage and the drive node.

According to another aspect of the embodiments, a drive circuit includes a CMOS type driver having an input coupled to the input signal and a driver output node that provides the internal input signal.

According to another aspect of the embodiments, a drive circuit can further include a first enable device coupled between the CMOS type driver and a power supply that provides a low impedance path when an enable signal has a first value. A second enable device can be coupled between the drive node and the driver output node, and can provide a low impedance path when the enable signal has a second value.

According to another aspect of the embodiments, an input receiver circuit can further include a level shift circuit that receives the internal input signal. The level shift circuit can include a pull-up leg that drives an output node to one of the at least two power supply voltages when the internal input signal has a first value, and a pull-down leg that drives the output node to different power supply voltage when the internal input signal has a second value. The different power supply voltage being different from any of the at least two power supply voltages.

DETAILED DESCRIPTION

Various embodiments of the present invention will now be described in detail with reference to a number of drawings. The embodiments include input receiver circuits that can select from between power supply voltages according to a comparison of power supply levels.

Figure 1:
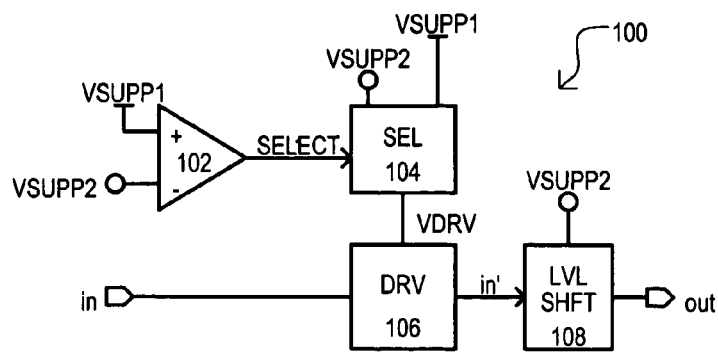
FIG. 1 is a block schematic diagram of a first embodiment of the present invention.

A first embodiment of the present invention is an input receiver circuit for an integrated circuit device (i.e., chip). The input receiver circuit is shown in FIG. 1 in a block schematic diagram and designated by the general reference character 100. An input receiver circuit 100 may include a comparator circuit 102, a supply selection circuit 104, an input receiver drive circuit 106, and a level shift circuit 108.

A comparator circuit 102 can compare a first power supply level VSUPP1 with respect to a second power supply level VSUPP2. In response to such a comparison, a select signal SELECT can be driven high or low. For example, in the particular case of FIG. 1, when VSUPP1>VSUPP2 signal SELECT can be high. In contrast, when VSUPP1<VSUPP2, signal SELECT can be low. It is understood that a comparator circuit 102 can include some hysteresis to avoid a non-detect region, and/or to provide a default value for signal SELECT in the event the two supply levels are essentially equal (VSUPP1=VSUPP2).

In response to signal SELECT, supply selection circuit 104 can provide a drive supply voltage VDRV to input receiver drive circuit 106. Such a drive voltage VDRV can be selected from multiple possible supply voltages. In the example of FIG. 1, such possible voltages include first power supply level VSUPP1 and second power supply level VSUPP2.

Input receiver drive circuit 106 can receive an input signal (in), and generate internal input signal (in') according to the level of drive supply voltage VDRV. Preferably, a drive supply voltage is selected to reduce current in a standby mode and/or an active mode. It is understood that a standby mode can include cases in which input signal (in) is at a constant level, while an active mode can include cases in which input signal (in) transitions between two or more levels.

A level shift circuit 108 can receive internal input signal (in') and generate an output signal (out). Level shift circuit 108 can ensure that output signal (out) is limited to a particular voltage range. In the example of FIG. 1, level shift circuit 108 can limit the swing of output signal (out) with respect to a second power supply level VSUPP2.

Having described the general arrangement of first embodiment, the operation of the first embodiment will now be described with reference to FIGS. 2A and 2B.

Figure 2A:
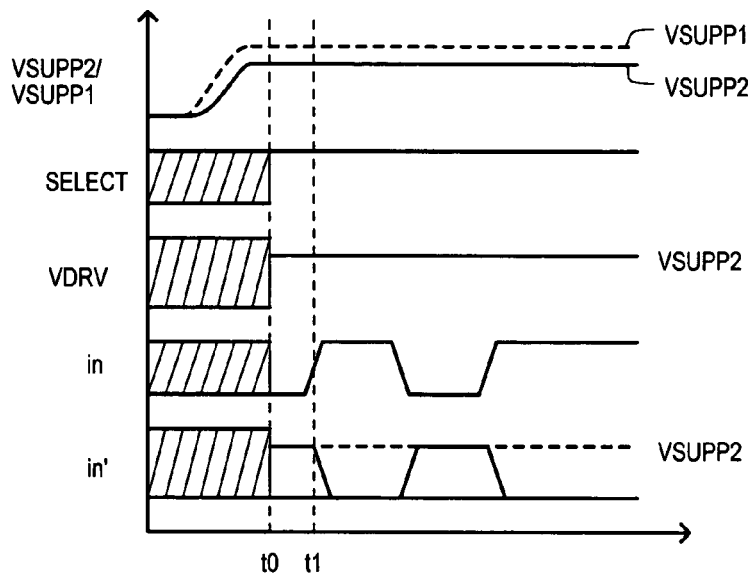
FIGS. 2A and 2B are timing diagrams showing the operation of the embodiment shown in FIG. 1.

Referring now to FIG. 2A in conjunction with FIG. 1, prior to a time t0, power supply levels VSUPP1 and VSUPP2 can be in transition.

After time t0, power supply levels can stabilize into a state in which VSUPP1>VSUPP2. In such a state, comparator circuit 102 can drive signal SELECT high. In response to such a high input, supply selection circuit 104 can select second power supply VSUPP2 (i.e., the lower of the two power supplies) as a drive supply voltage VDRV. Thus, at time t0, VDRV=VSUPP2.

At time t1, input signal (in) can begin making transitions. A resulting internal input signal (in') can be driven in response to such transitions by input receiver drive circuit 106. In this particular example, internal input signal (in') can be the inverse of input signal (in), and can have a signal swing limited to a second power supply level VSUPP2.

Thus, in the case where VSUPP1>VSUPP2, power supply SUPP2 can be provided to input receiver drive circuit 106.

Figure 2B:
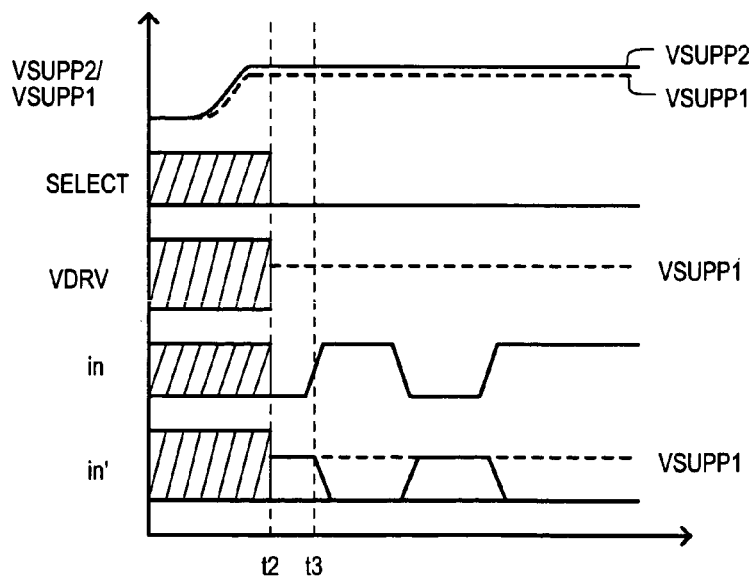

Referring now to FIG. 2B in conjunction with FIG. 1, prior to a time t2, power supply levels VSUPP1 and VSUPP2 can be in transition once again.

After time t2, power supply levels can stabilize. However, unlike the case set forth in FIG. 2A, in FIG. 2B VSUPP2>VSUPP1. In such a state comparator circuit 102 can drive signal SELECT low. In response to such a low input, supply selection circuit 104 can select second power supply level VSUPP1 as a drive supply voltage VDRV. Thus, at time t0, VDRV=VSUPP1.

At time t3, input signal (in) can being making transitions. As shown by FIG. 2B, internal input signal (in') can have a signal swing limited to a first power supply level VSUPP1.

Thus, in the case where VSUPP2>VSUPP1, power supply VSUPP1 can be provided to input receiver drive circuit 106.

A second embodiment will now be described with reference to FIG. 3.

Figure 3:
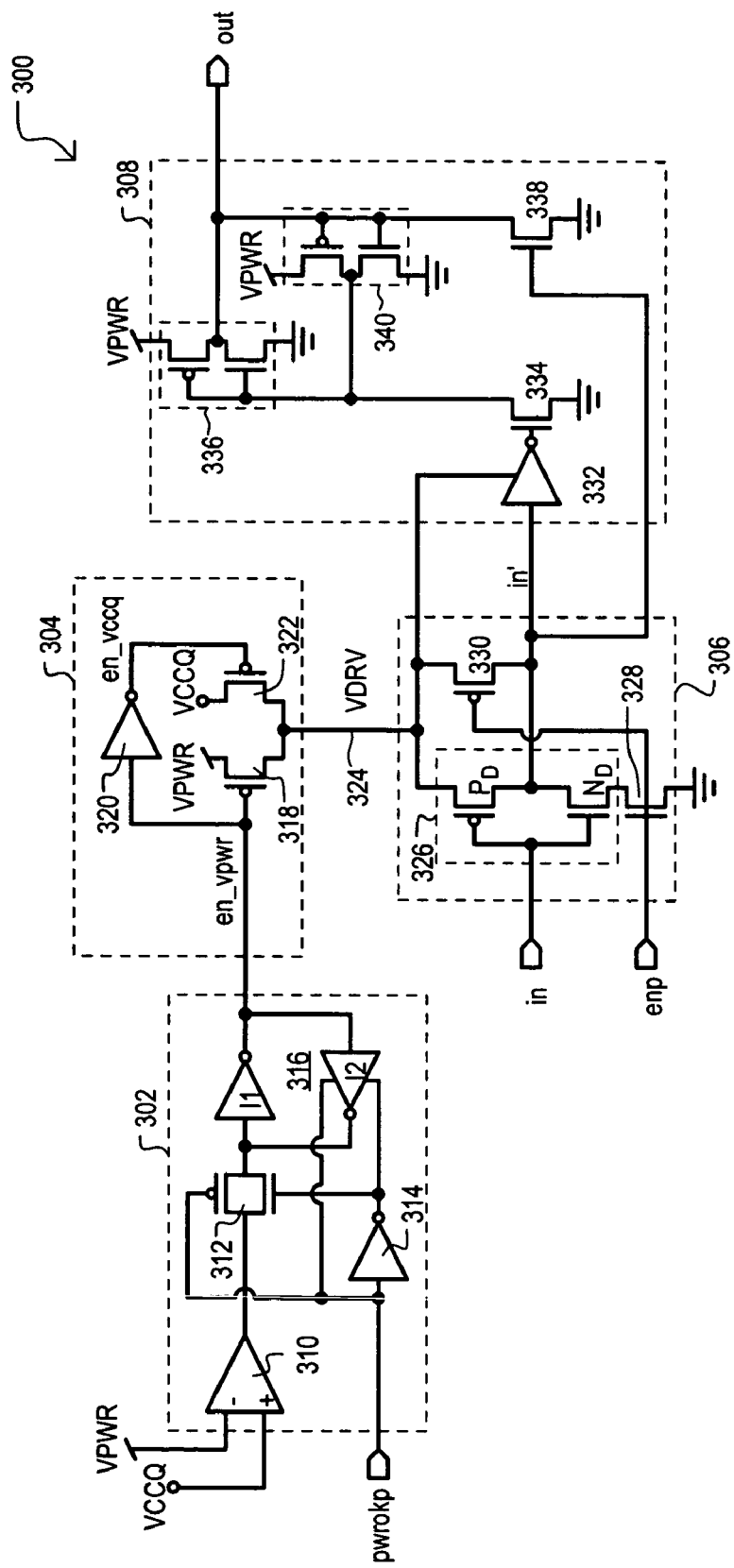
FIG. 3 is a schematic diagram of an input receiver circuit according to a second embodiment.

FIG. 3 is a detailed schematic diagram showing a second embodiment of the present invention. The second embodiment is designated by the general reference character 300 and can have some of the same general sections as FIG. 1. Accordingly, like sections will be referred to by the same reference character but with the first digit being a "3" instead of a "1".

The embodiment of FIG. 3 may include two power supplies (VCCQ and VPWR) that can be switched to supply an input receiver based on a difference (e.g., VCCQ−VPWR) between such power supplies.

As will be described at a later point herein, a power supply difference (e.g., VCCQ−VPWR) can be determined within a power-up time. A power-up time may be, as but a few examples, a time when power supply levels are raised as power is applied to a part (e.g., chip) and/or in some cases, including additional time for circuit reset and the like).

Of course, a power-up time is but one example of when supplies can be switched and/or the selection determined. Other possible suitable times may include a standby time, the end of an active cycle, or any other time when the timing may be relatively non-critical. Thus, a power-up signal (pwrokp) should not necessarily be limited to indicating a power-up operation, and could represent other conditions and/or be replaced or logically combined with other status/timing signals.

The particular example of FIG. 3 can provide selection of a power supply voltage according to the following example cases:
(i) If VCCQ−VPWR>0 then the VPWR power supply may be used.
(ii) If VCCQ−VPWR<0 then the VCCQ power supply may be used.
(iii) If VCCQ=VPWR then the default supply may be used (VPWR or VCCQ, either of which can be designated as a default value for this case).

The current savings advantages achieved by such a selection arrangement will be described in more detail at a later point herein.

As shown in FIG. 3, in a second embodiment input receiver circuit 300, a comparator circuit 302 can include comparator 310 that compares VCCQ and VPWR power supply levels. The result of such a comparison can be provided as an input to passgate 312. The output of passgate 312 can be provided by latch 316. Latch 316 can include cross-coupled inverters (I1 and I2), and provide a first select signal (en_vpwr) as an output. Passgate 312 and latch 316 can be enabled according to a power up signal (pwrokp) and its inverse generated by inverter 314.

A supply selection circuit 304 can receive first select signal (en_vpwr), which can be applied to a first select device 318. First select signal (en_vpwr) can be inverted by inverter 320 to generate a second select signal (en_vccq). Second select signal (en_vccq) can be applied to a second select device 322. In the particular arrangement of FIG. 3, a first select device 318 can be a p-channel transistor having a source-drain path between power supply VPWR and a drive node 324, and a gate that receives first select signal (en_vpwr). Similarly, a second select device 322 can also be a p-channel transistor having a source-drain path between power supply VCCQ and drive node 324, and a gate that receives second select signal (en_vccq).

A supply selection circuit 304 can thus be conceptualized as including a multiplexer that receives multiple power supply voltages as inputs, and provides a selected power supply voltage as an output based on a selection signal.

An input drive section 306 of the second embodiment 300 can include a complementary metal oxide (CMOS) type driver 326, a first enable device 328 and a second enable device 330. A CMOS type driver 326 can include a CMOS inverter composed of a p-channel transistor ($P_D$) and an n-channel transistor ($N_D$). CMOS type driver 326 can receive an input signal (in) at the gates of transistors ($P_D$ and $N_D$) and a high power supply level from drive node 324 connected to the source of transistor $P_D$. A first enable device 328 can include an n-channel transistor having a source-drain path arranged between a source of transistor $N_D$ and a low power supply voltage (e.g., ground). A second enable device 330 can include a p-channel transistor having a source-drain path arranged between drive node 324 and the output of CMOS type driver 326. The output of CMOS type driver 326 can provide an internal input signal (in').

A level shift circuit 308 can include a driver 332 that receives internal input signal (in') in response to thereto, can enable a pull-up path device 334. A driver 330 can have a high level limited by the potential (VDRV) at drive node 324. A pull-up path device 334 can include an n-channel transistor having a source-drain path arranged between an output driver 336 and a low power supply. Internal input signal (in') can also be applied to a pull-down path device 338. A pull-down path device 338 can include an n-channel transistor having a source-drain path arranged between a latching driver 340 and a low power supply. Latching driver 340 and output driver 336 can be cross coupled inverters coupled to power supply VPWR. The output of output driver 336 can be output signal (out).

Figure 4:
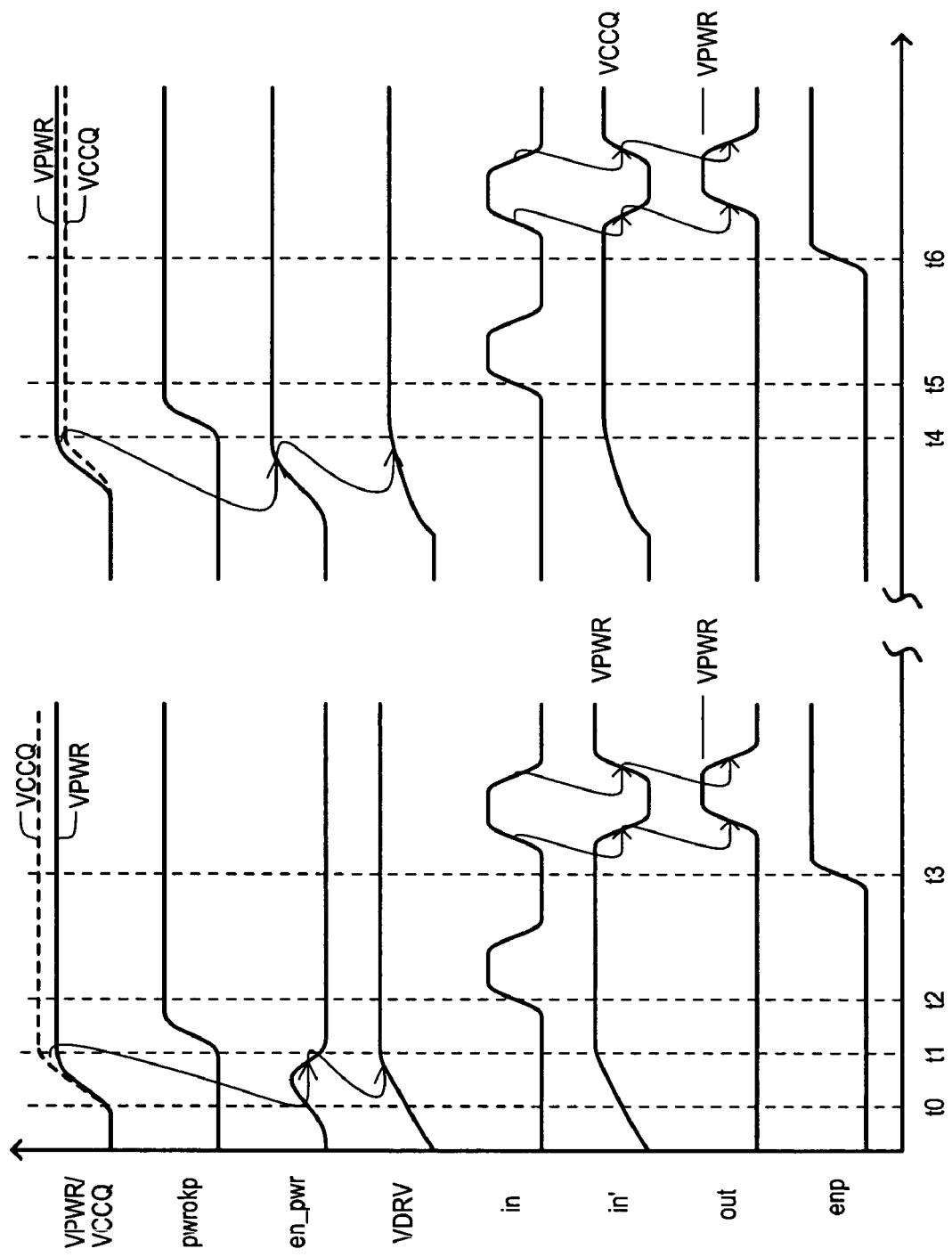
FIG. 4 is a timing diagram showing the operation of the embodiment shown in FIG. 3.

Having described the general components of an input receiver 300 according to a second embodiment, the operation of the second embodiment will now be described with reference to FIGS. 3 and 4. FIG. 4 is a timing diagram showing the operation of the second embodiment.

As shown in FIG. 4, at about time t0 power supply levels for power supplies VPWR and VCCQ can begin to rise. As but one example, such an arrangement can result during a power-up operation.

Between times t0 and t1, power-up signal (pwrokp) can be low. Consequently, within comparator circuit 302, passgate 312 can be enabled allowing output of comparator 310 to flow through to latch 316. It is noted that at this time, inverter 12 may be disabled.

At about time t1, comparator 310 can determine that VCCQ>VPWR. As a result, output of comparator 310 (en_vpwr) can be driven low. With signal en_vpwr low, first select device 318 can turn on providing power supply VPWR to drive node 324. At the same essential time, inverter 320 can drive signal en_vccq high, turning off second select device 322. In this way, when VCCQ>VPWR, input receiver drive circuit 306 can be supplied with the power supply VPWR.

Because enable signal (enp) is low at this time, internal input signal (in') can be driven to the potential at drive node 324, which is in this case can be VPWR.

Within level shift circuit 308, a high internal input signal (in') can result in pull-up path device 334 being turned off and pull-down path device 338 being turned on. As a result, output signal (out) can be forced low, and maintained in the low state by output driver 336 and latching driver 340.

At about time t2, power-up signal (pwrokp) can rise to a high level. This can indicate that power supply levels are now stabilized. Within comparator circuit 302, passgate 312 can be disabled, and inverter 12 may be enabled, latching the comparison output from comparator 310. This can ensure that power supply VPWR will be continued to be supplied to drive node 324, until power-up signal (pwrokp) returns low (e.g., in response to a reset operation, power down, etc.).

Also at time t2, input signal (in) may make a transition. However, enable signal (enp) is still low at this time. As a result, there is no change in the levels of internal input signal (in') and output signal (out).

At about time t3, enable signal (enp) can rise to a high level, turning on first enable device 328 and turning of second enable device 330. Input receiver drive circuit 306 can thus driver internal input signal (in') between the supply level VPWR and a lower power supply.

Referring still to FIG. 4, prior to time t4, power-up signal (pwrokp) may have returned low.

At about time t4, levels of power supplies VPWR and VCCQ can begin to rise, and the circuit can operate essentially in the same fashion as described for time t0 to t1.

At about time t4, comparator 310 can determine that VCCQ<VPWR. As a result, output of comparator 310 (en_vpwr) can be driven high. With signal en_vpwr high, first select device 318 can turn off, isolating power supply VPWR from drive node 324. At the same essential time, inverter 320 can drive signal en_vccq low, turning on second select device 322 to provide power supply VCCQ to drive node 324. In this way, when VCCQ<VPWR, input receiver drive circuit 306 can be supplied with the power supply VCCQ.

Input circuit 300 can then operate in the same essential fashion as described above, with the exception that input receiver drive circuit 306 can drive internal input signal (in') between the supply level VCCQ and a low power supply.

Having described the operation of various embodiments, possible current saving advantages of such embodiments will now be described.

The general current saving advantages will be described according to one particular signal level convention. However, one skilled in the art would recognize that the invention should not be limited to such particular signal level values, and may be applicable to different voltage levels according to transistor threshold and power supply levels.

For the purposes of this description it will be assumed that an input signal (in) can have, transistor-transistor-logic (TTL) levels. Such TTL logic levels can vary according to an input supply voltage VCCQ. As but one example, a VCCQ level may vary from about 1.65V to about 3.1V. A product specification for this example may define the input signal levels as follows, where "Vih" is the input high voltage and "Vil" is the input low voltage:

$Vih = (0.8 * VCCQ) - 100$ mV $Vil = (0.2 * VCCQ) + 100$ mV

Because the value of VCCQ can range from about 1.65V to about 3.1V, so can the dependant values of Vih and Vil. This can thus define two new terms for the operation of the receiver:

(1) Most Positive Down Level (MPDL); and
(2) Least Positive Up Level (LPUL).

The MPDL can be determined by which VCCQ level may give the highest Vil level. From the Vil equation above, the highest Vil can occur for the highest VCCQ level. The opposite may be the case for the LPUL. The LPUL can be determined by which VCCQ level will give the lowest Vih level.

LPUL and MPDL are defined as follows:

$$MPDL = (0.2 * VCCQ_{MAX}) + 100 \text{ M V}$$

$$LPUL = (0.8 * VCCQ_{MIN}) - 100 \text{ mV}$$

By plugging in values for $VCCQ_{MAX}$ and $VCCQ_{MIN}$, the MPDL and LPUL can become:

$$MPDL = (0.2 * 3.1V) + 100 \text{ mV} = 0.72V$$

$$LPUL\ (0.8 * 1.65) - 100 \text{ mV} = 1.22V$$

Therefore, the switch point of the receiver may be between about 0.72V and about 1.22V.

Such levels can have considerable impact on active and standby current of an input receiver circuit. Standby current will now be described with reference to FIG. 5 and FIGS. 6A to 6B.

Figure 5:
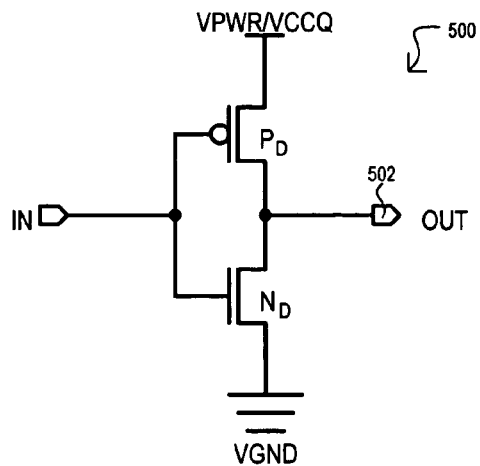
FIG. 5 is a schematic diagram of a complementary-metal-oxide-semiconductor (CMOS) type inverter that illustrates the current reducing features of the second embodiment.

FIG. 5 shows a CMOS driver 500 which can represent an enabled input receiver drive circuit such as that shown in FIG. 3 as item 326.

Figure 6A:
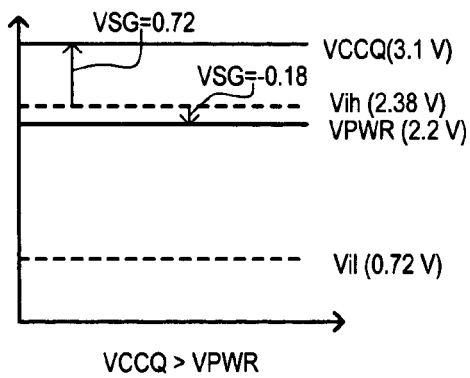
FIGS. 6A and 6B are voltage diagrams illustrating variations in gate-to-source voltage of a CMOS type inverter according to variations in supply voltage values.
Figure 6B:
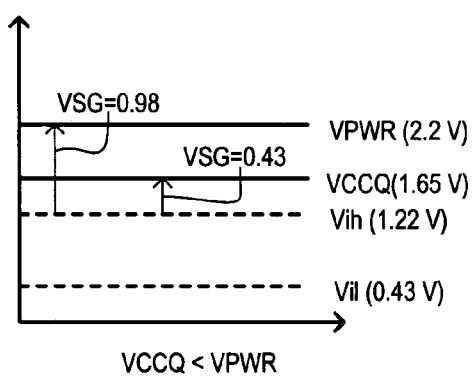

FIG. 6A is a diagram showing various signal levels for a case where VCCQ>VPWR. FIG. 6B is a diagram showing various signal levels for a case where VCCQ<VPWR.

Referring now to FIG. 5 in conjunction with FIG. 6A, a particular case is illustrated in which VCCQ=3.1 V and VPWR=2.2 V. In such an arrangement, Vil= MPDL=0.72V, and Vih=2.38V.

If, in this very particular example, VCCQ is provided as a supply voltage for CMOS driver 500 a high standby current can result.

Ideally, when input signal (in) is high, PMOS device $P_D$ should be fully off, while NMOS device $N_D$ should be fully on. Conversely, in an ideal case, when input signal (in) is low, PMOS device $P_D$ should be fully on, while NMOS device $N_D$ should be fully off. As would be understood, with one driver device fully off, a relatively minimal leakage current will be drawn by CMOS driver 500.

However, certain power supply levels and threshold voltage combinations can result in a non-ideal response. When input signal (in) is at an input high level, as the overdrive (i.e., "overdrive" may be defined as the VGS of a NMOS device and the VSG of a PMOS device) voltage approaches the threshold of the device, more and more current is drawn by the input receiver.

In the example of FIG. 6A, it will be assumed that CMOS driver 500 has an overdrive voltage of about 0.72 V. At the same time, a threshold voltage of PMOS device $P_D$ can be about 0.72 V. At high temperatures, such a threshold voltage can get even lower. As shown in FIG. 6A, when input signal (in) is at the high level (Vih= 2.38 V) and a power supply to CMOS driver 500 is VCCQ (3.1 V), a VSG of PMOS device $P_D$ can be about 0.72 V. Thus, PMOS device PD may be "on" and current can flow through the PMOS device PD. This is undesirable because, as noted above, when input signal (in) is high, NMOS device ND is fully on. Thus, PMOS device PD may be conducting while NMOS device $N_D$ is conducting, drawing a current through CMOS driver 500.

Accordingly, for the case where VCCQ>VPWR, an undesirably large amount of stand by current can be drawn by CMOS driver 500.

In contrast, it will be assumed that CMOS driver 500 is supplied by supply voltage VPWR instead, as would automatically occur in the operation of the second embodiment.

In this case, the overdrive voltage is about −0.18V (as shown in FIG. 6A, VSG= −0.18 V). As a result, PMOS device PD can be completely off, and hence CMOS driver 500 can consume essentially no current (e.g., only a very small leakage current).

From the above, it can be understood that it is preferable to provide VPWR as a drive voltage in situations where VCCQ>VPWR, as occurs automatically in the second embodiment.

However, simply using power supply VPWR for an input driver all the time can also provide undesirable results. One such situation is shown in FIG. 6B. FIG. 6B shows the case where VCCQ=1.65V and VPWR=2.2V. From the above relationships, Vih=LPUL=1.22V and Vil=0.43V.

Referring to FIG. 5 in conjunction with FIG. 6B, if input signal (in) is at about a Vih level and power supply VPWR is provided to CMOS driver 500, the overdrive voltage is about 0.98V. As a result, PMOS device $P_D$ can be on and conducting a relatively large amount of current (as NMOS device $N_D$ is fully on at this time). However, if the power supply VCCQ is provided to CMOS driver 500, the overdrive voltage is about 0.43V and the PMOS device $P_D$ can be off, but may still have some sub-threshold leakage current.

From the above, it can be understood that it is preferable to provide VCCQ as a drive voltage in situations where VCCQ<VPWR, as would automatically occur in by operation of the second embodiment.

In this way, by choosing which power supply (e.g., VCCQ or VPWR) is selected according to comparative voltage, an input receiver according to the embodiments can minimize standby current.

Figure 7:
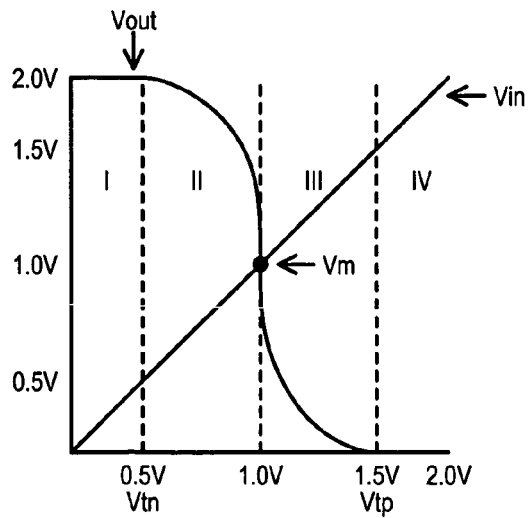
FIG. 7 is a diagram illustrating higher current consumption ranges for a CMOS type inverter.
Figure 8:
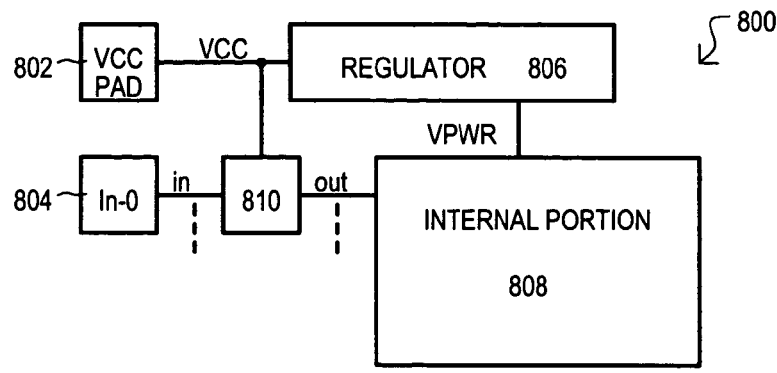
FIG. 8 is a block schematic diagram of a first conventional input receiver circuit arrangement.
Figure 9:
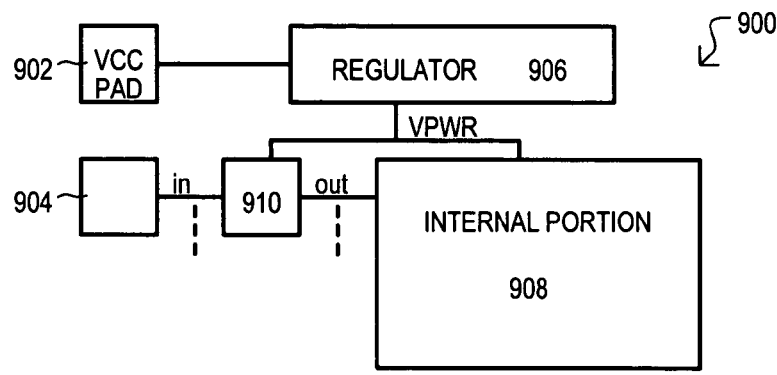
FIG. 9 is a block schematic diagram of a second conventional input receiver circuit arrangement.
Figure 10:
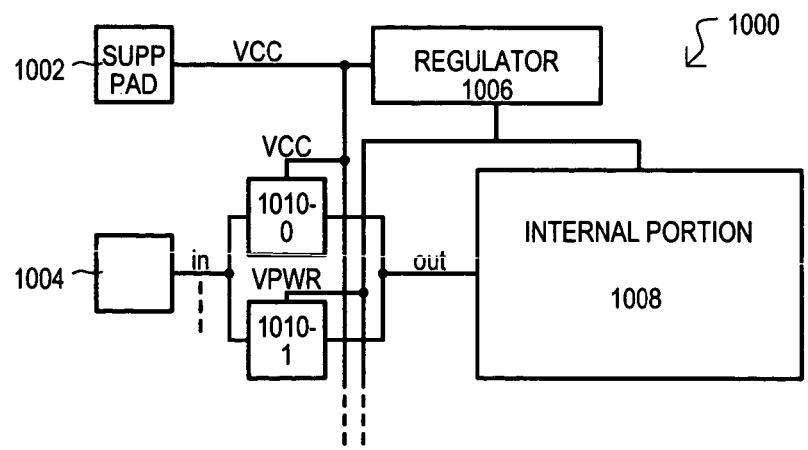
FIG. 10 is a block schematic diagram of a third conventional input receiver circuit arrangement.

The above examples have shown how an input receiver circuit according to the embodiments can reduce standby current. However, such arrangements may PMOS device $P_D$ can be conducting current no matter what the level of the input voltage. So, for example (considering the CMOS driver circuit 326 of FIG. 3 as a standard CMOS driver 500 for analysis purposes), when switching from a logic low to a logic high at the input of the CMOS driver circuit 326, the NMOS device ND may have a tougher time discharging the output node 502. Thus, more active current (i.e., switching current) can be conducted through the circuit at this time. FIG. 7 and Table 1 (below) show the normal operations of a CMOS inverter when the input switches from a ground level to the power supply (i.e., "rail-to-rail" signal transition).

Table 1 includes terms "LINEAR" and "SATURATION." In terms of current, LINEAR can be considered as drawing relatively little current and SATURATION can be considered as drawing a relatively large amount of current. In FIG. 7 and Table 1, there are four regions of operation listed for the CMOS driver. In addition, there is another region of operation, "Vm," where Vm is the point where the input signal level is equal to the output signal level. Both PMOS device PD and NMOS device ND are in SATURATION about this point. Therefore, a relatively large amount of current can be consumed when operating in this region. This point is also known as the "meta-stable" point.

TABLE 1

Boundaries of operation for CMOS inverter

| Region | NMOS device | PMOS device |
|--------|-------------|-------------|
| I      | OFF         | ON          |
| II     | SATURATION  | LINEAR      |
| III    | LINEAR      | SATURATION  |
| IV     | ON          | OFF         |

Referring to FIG. 7 in conjunction with Table 1, it can be seen that, in order to reduce active current, it would be desirable to minimize the time spent in regions II, III, and the meta-stable point Vm.

If VPWR was used as an input receiver power supply and, for example, VPWR=2.2V, VCCQ=1.65V, Vih=1.22V, and Vil=1.4V, a CMOS driver 500 may operate predominantly in the regions I, II, III and at the meta-stable point. Therefore, when switching the input from logic low to logic high, NMOS device $N_D$ may have to essentially work harder to discharge the output node 502. Because the NMOS device $N_D$ is working harder (i.e., is "sinking" current at a greater rate than current "sourced" by PMOS device $P_D$), a CMOS driver 500 can operate longer in regions II, III and also near the meta-stable point, Vm.

However, by employing an arrangement that can select between at least a two power supply values, as shown by the various embodiments, a CMOS driver 500 may spend less time in the SATURATION regions during switching between logic values, and thus draw less active current.

In this way, favorable selection of power supply voltages, as can automatically occurs in the operation of the various embodiments, can result in reductions in active current in addition to reductions in standby current.

Figure 11:
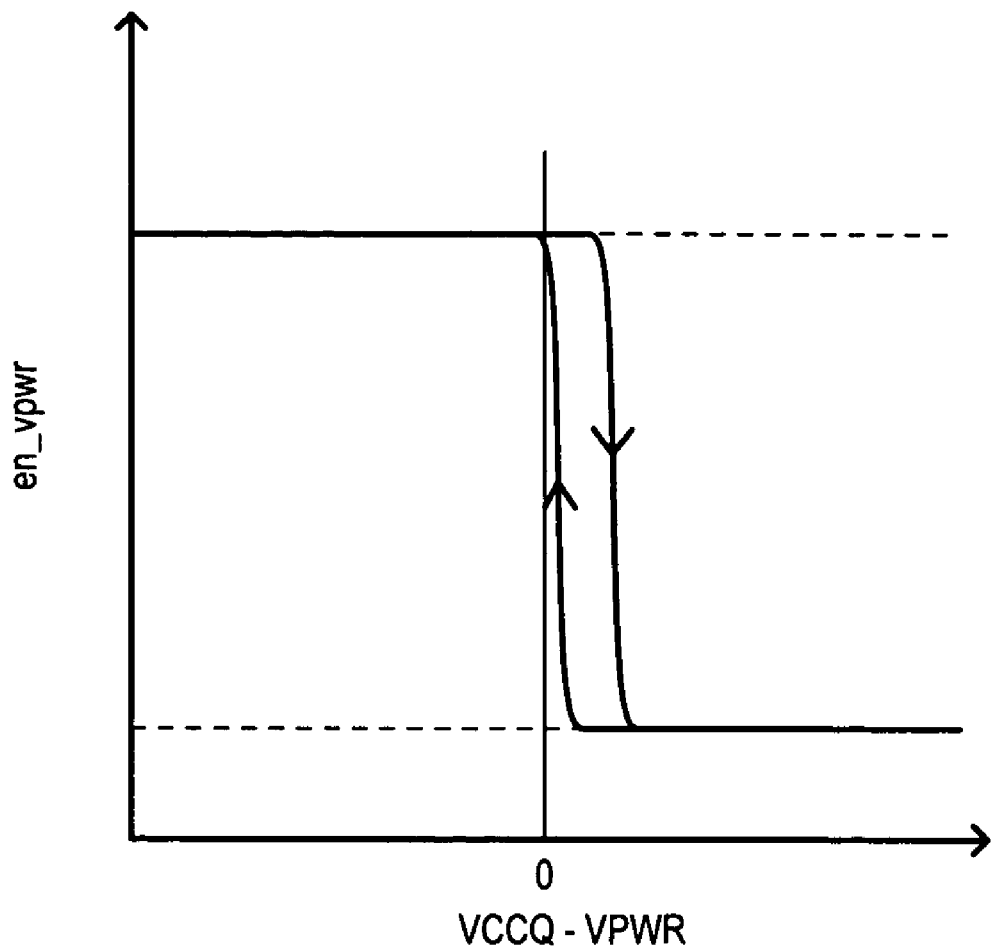
FIG. 11 is a voltage diagram showing one example of hysteresis that can be included in a comparator of the embodiments of the present invention.

As noted in conjunction with FIG. 1, a comparator circuit (e.g., item 102 and/or item 310 of FIG. 3) can include some hysteresis. FIG. 11 represents but one of the many possible hysteresis arrangements that can be employed to ensure a stable compare value is given. FIG. 11 also shows an arrangement which can set a default value for the case where VCCQ=VPWR. In this case, when VCCQ=VPWR, signal en_vpwr can be low.

The embodiments disclosed herein can provide advantages over the other conventional approaches described above. One advantage can be that input receiver circuits can be optimized for both standby and active current reduction. Further, an input receiver circuit can be able to select from two possible supplies based primarily on a comparison of their values upon power-up. No additional enable signal and/or other permanent setting circuits (e.g., fuse or metal options) can be required to establish a given power supply voltage.

One skilled in the art would recognize that the embodiments provide greater flexibility over conventional arrangements that force a permanent selection of one supply voltage.

Of course, as discussed above, the power-up time is only one example of when the supplies can be switched or the selection determined. Other possible suitable times may include standby, the end of an active cycle, or other times when the timing is relatively non-critical.

While the various input receiver circuits and variations disclosed herein may enjoy a wide variety of applications, such circuits may be particularly useful in low power applications, such as low power pseudo static random access memories (PSRAMs), as but one very particular example.

It is understood that other embodiments of this invention may be practiced in the absence of an element/step not specifically disclosed herein.

Still further, while the embodiments have disclosed input receiver circuits that receive two power supply voltages, one skilled in the art would recognize the embodiments may also accommodate a larger number of power supply voltages by adding comparators as needed.

In addition, power supply voltages compared by the various embodiments may be both externally applied power supply voltages and/or internally generated power supply voltages.

Accordingly, while the various aspects of the particular embodiments set forth herein have been described in detail, the present invention could be subject to various changes, substitutions, and alterations without departing from the spirit and scope of the invention.

What is claimed is:

1. A circuit that selects between at least two power supplies, comprising:
   an input receiver coupled to receive an input signal and a drive supply that generates a receiver output signal;
   a supply comparator having inputs coupled to the at least two power supplies that generates at least one select signal;
   a select circuit coupled to the at least two power supplies and the drive supply; and
   a latch coupled to the at least one select signal and to the select circuit.

2. The circuit of claim 1, wherein:
   the input receiver further includes a driver circuit that receives the input signal and generates an internal input signal, the driver circuit including at least a first driver transistor having a source coupled to the drive supply and a gate coupled to the input signal.

3. The circuit of claim 2, wherein:
   the driver circuit comprises a complementary-metal-oxide-semiconductor (CMOS) type driver.

4. The circuit of claim 2, wherein:
   the input receiver further includes a first disable device that isolates the driver circuit from at least one power supply in response to an enable signal.

5. The circuit of claim 2, wherein:
   the input receiver further includes a second disable device that couples an output of the driver circuit to the driver supply in response to an enable signal.

6. The circuit of claim 1, wherein:
   the select circuit comprises a multiplexer having inputs coupled to the at least two power supplies that is controlled according to an output of the latch.

7. The circuit of claim 1, wherein:
   the latch is enabled in response to a power up signal.

8. A method of controlling a power supply path to an input receiver, comprising the steps of:
   comparing at least two power supply voltages to one another;
   setting a latch to indicate one of the at least two power supplies as a selected supply according to said comparison; and
   providing the selected supply to the input receiver according to the setting of the latch.

9. The method of claim 8, wherein:
   the step of setting the latch occurs substantially during a power-up of an integrated circuit containing the input receiver circuit.

10. The method of claim 8, wherein:
    the step of setting the latch includes setting the latch to indicate the power supply having the lowest magnitude voltage.

11. The method of claim 8, further including:
    level shifting an output from the input receiver to generate an output signal that varies between predetermined logic levels regardless of which at least one power supply is selected.

12. An input receiver circuit, comprising:
a comparator circuit that generates a select signal in response to a comparison between at least two power supply voltages;
a select circuit that couples one of the at least one power supply voltages to a drive node according to the select signal; and
a drive circuit that drives an internal input signal between the potential of the drive node and another predetermined potential in response to an input signal, the drive circuit including a complementary-metal-oxide-semiconductor (CMOS) type driver having an input coupled to receive the input signal and a driver output node that provides the internal input signal.

13. The input receiver circuit of claim 12, wherein:
the comparator circuit includes a comparator having inputs coupled to the at least two power supplies and an output coupled to a pass-gate that is enabled in response to a power-up signal having a first value.

14. The input receiver circuit of claim 13, wherein:
the comparator circuit further includes a latch having an input coupled to an output of the passgate, and a latch output that provides the select signal, the latch being enabled in response to the power-up signal having a second value.

15. The input receiver circuit of claim 12, wherein:
the select circuit comprises a first supply transistor having a source-drain path coupled between a first supply voltage and the drive node and a second supply transistor having a source-drain path coupled between a second supply voltage and the drive node.

16. The input receiver circuit of claim 12, wherein:
a drive circuit further includes
    a first enable device coupled between the CMOS type driver and a power supply that provides a low impedance path when an enable signal has a first value, and
    a second enable device coupled between the drive node and the driver output node that provides a low impedance path when the enable signal has a second value.

17. The input receiver circuit of claim 12, further including:
a level shift circuit that receives the internal input signal, the level shift circuit including
    a pull-up leg that drives an output node to one of the at least two power supply voltages when the internal input signal has a first value, and
    a pull-down leg that drives the output node to a different power supply voltage when the internal input signal has a second value, the different power supply voltage being different from any of the at least two power supply voltages.

* * * * *